United States Patent
Podney

[11] Patent Number: 5,675,252
[45] Date of Patent: Oct. 7, 1997

[54] COMPOSITE STRUCTURED PIEZOMAGNETOMETER

[75] Inventor: Walter N. Podney, San Diego, Calif.

[73] Assignee: SQM Technology, Inc., La Jolla, Calif.

[21] Appl. No.: 491,392

[22] Filed: Jun. 19, 1995

[51] Int. Cl.$^6$ .................................................. G01R 33/02
[52] U.S. Cl. ........................ 324/244; 324/209; 73/862.69
[58] Field of Search ........................................ 324/244, 209, 324/207.11–207.14, 207.22–207.26, 244.1, 260; 310/323, 311, 364, 328, 321, 333; 73/DIG. 2, 862.69, 862.68, 779

[56] References Cited

U.S. PATENT DOCUMENTS

| | | | |
|---|---|---|---|
| 4,769,599 | 9/1988 | Mermelstein | 324/244 |
| 4,866,384 | 9/1989 | Oetzmann | 324/244 |
| 4,894,615 | 1/1990 | Mermelstein | 324/244 |
| 4,920,806 | 5/1990 | Obama et al. | 73/779 |
| 5,103,174 | 4/1992 | Wandass et al. | 324/244 |
| 5,130,654 | 7/1992 | Mermelstein | 324/244 |
| 5,396,166 | 3/1995 | Vohra et al. | 324/96 |

OTHER PUBLICATIONS

Levitin et al., "Magnetorestriction Measurements . . . ", Physica B, vol. 177, pp. 59–62 (North Holland 1992).
Mermelstein et al., "Low Frequency Magnetic Field Detection . . . ", Applied Physics Letters, vol. 51, No. 7, pp. 545–547 (Aug. 17, 1987).
Lynch et al., "A New Magnetic Snesor Technology", GEC Journal of Research, vol. 8, No. 1, pp. 13–20 (1990).
M.D. Mermelstein, "Magnetoelastic Amorphous Metal Fluxgate Magnetometer", Electronics Letters, vol. 22, No. 10, pp. 525–526 (May 8, 1986).
Pantinakis et al., "High–Sensitivity Low–Frequency Magnetometer . . . ", Electronics Letters, vol. 22, No. 14, pp. 737–738 (Jul. 3, 1986).

*Primary Examiner*—Sandra L. O'Shea
*Assistant Examiner*—Jay M. Patidar
*Attorney, Agent, or Firm*—James Creighton Wray

[57] ABSTRACT

A piezomagnetometer uses a magnetoelectric composite structure, formed by alternating layers of piezoelectric and magnetostrictive material, to convert a fluctuating magnetic field directly to electric current. Strain in the magnetostrictive layers, coming from an ambient magnetic field, stresses piezoelectric layers and drives a polarization current proportional to amplitude of the ambient field. Electrically, the composite is a current source connected in parallel with a capacitor. Its simple and direct operation and solid state sensor enables constructing a small, rugged, inexpensive magnetometer that operates at an ambient temperature with high sensitivity at low power. Multiple piezomagnetometers can be incorporated into a practical detection system capable of operating at ambient temperatures and meeting the limitations presented in civilian and military operations.

22 Claims, 3 Drawing Sheets

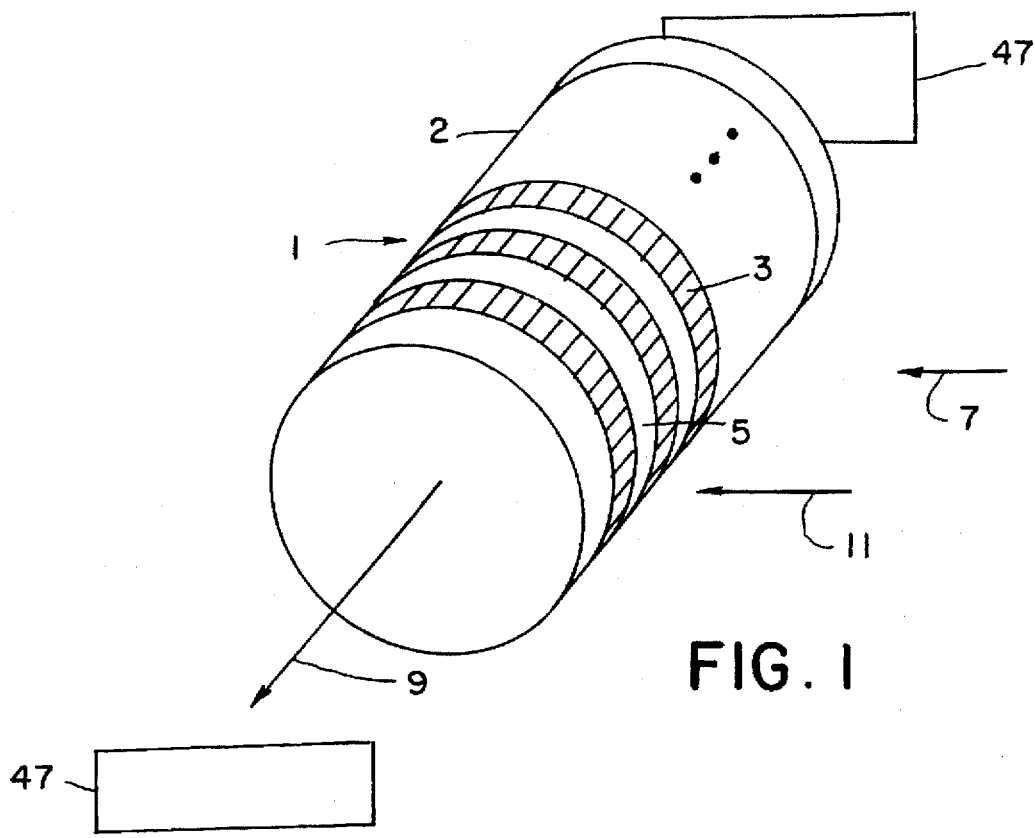
FIG. 1
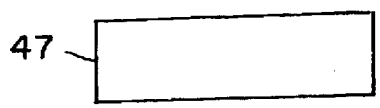
FIG. 2
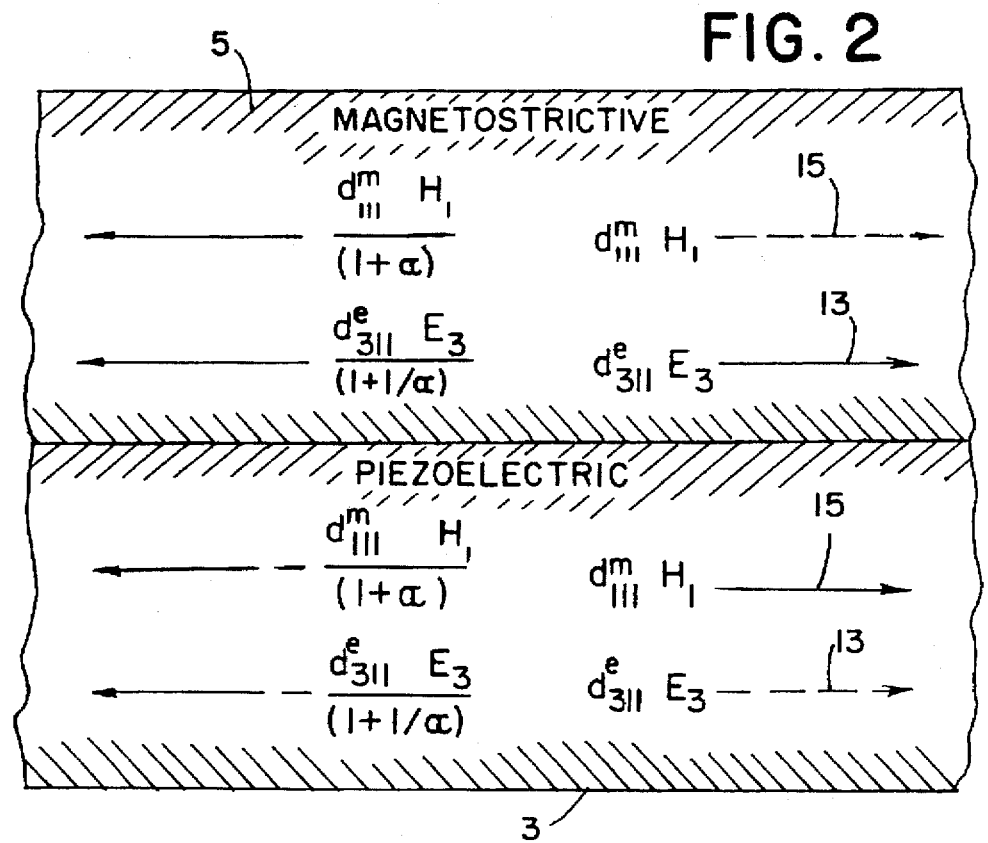

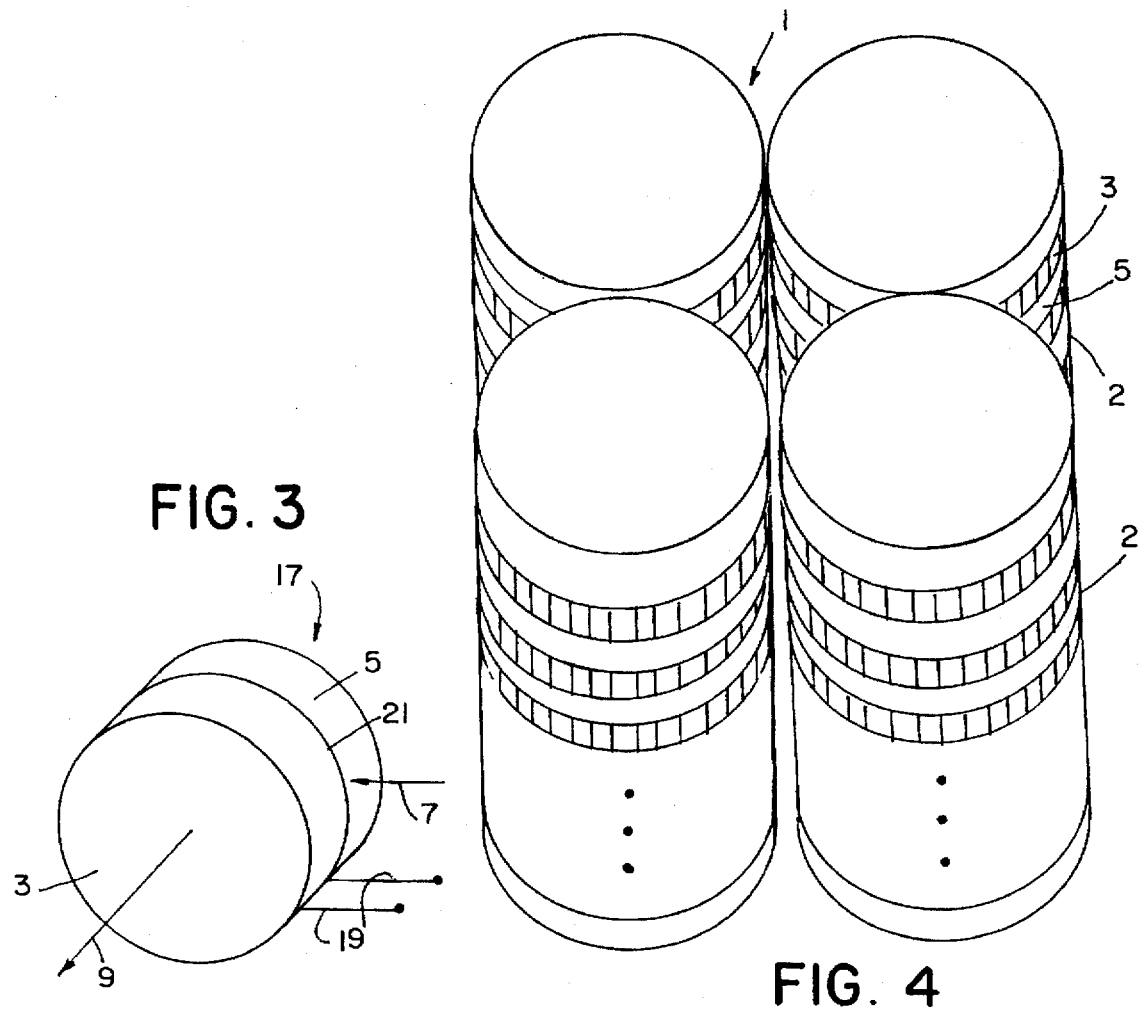
FIG. 3
FIG. 4
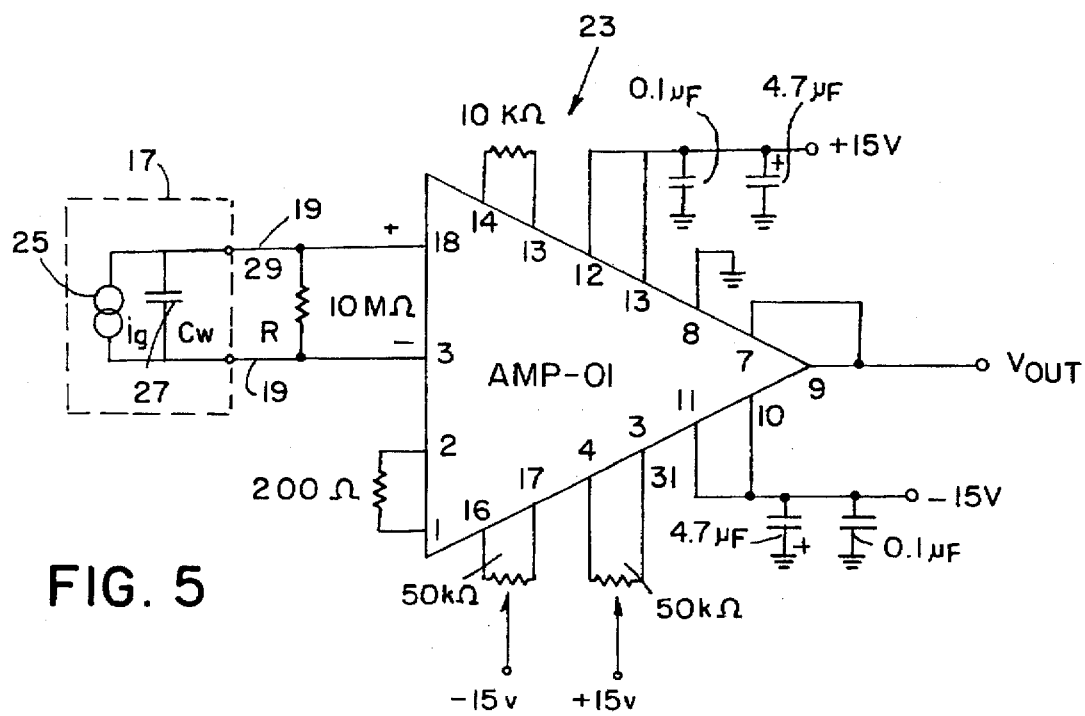
FIG. 5

COMPOSITE STRUCTURED PIEZOMAGNETOMETER

BACKGROUND OF THE INVENTION

This invention relates to magnetometers for detecting and measuring magnetic and electric fields.

Needs exist for magnetometers that can operate at ambient temperatures and meet the limitations presented in civilian and military operations. Operational objectives require detection at ranges of 50 meters or more for passenger vehicles, trucks, and other vehicles, and at comparable detection ranges for persons on foot, carrying arms or equipment. Ranges of that magnitude require magnetometers with resolution of the order of one picotesla $(pT)/\sqrt{Hz}$ or better to be a realistic means for broad detection of persons and material. A sensitivity of that order is also required where the magnetometers are elevated above the ground. In addition, desired operations dictate that the magnetometers operate passively without using a carrier frequency or a power supply.

Existing magnetometers do not meet those requirements.

Fiber optic magnetometers use laser interferometers to measure strain in optical fibers coupled to magnetostrictive material. Strain in the fibers is proportional to the square of the magnetic field applied to the magnetoelastic material. A steady, magnetic bias and a high frequency carrier are used to mix low frequency, ambient magnetic oscillations into sidebands of the carrier. Noise in the sidebands limits resolution to about 10 $pT/\sqrt{Hz}$ at frequencies of a few Hertz.

Magnetoelastic, fluxgate magnetometers use piezoelectric transducers to apply stress to magnetostrictive material and measure resulting changes in magnetization with induction coils. In one type, piezoelectric transducers drive stress oscillations in magnetoelastic material inside transduction coils. The coils measure fluctuations in magnetization resulting from the oscillating stress, Ambient magnetic oscillations at low frequency modulate amplitude of the oscillating magnetization. Resolution is only about 10 $pT/\sqrt{Hz}$ at frequencies of a few Hertz. In a second type, a piezoelectric transducer is coupled to a METGLAS strip inside a solenoid. The transducer provides a feedback current that is used to null magnetic fluctuations in the strip at the carrier frequency driving the solenoid. Ambient magnetic fluctuations modulate the net current in the solenoid because of mixing by the METGLAS strip. Signal resolution of that type is only about 200 $pT/\sqrt{Hz}$ at frequencies of a few Hertz.

Needs exist for small size, low power, low cost magnetometers With greater signal resolution. Needs exist for magnetometers that are direct, passive and linear to reduce the need for power and to improve operational characteristics.

SUMMARY OF THE INVENTION

The present invention relates to piezomagnetometers that fill needs for small, rugged, inexpensive magnetometers that operate at ambient temperatures with high sensitivity at low power. Alternating piezoelectric and magnetostrictive layers of piezomagnetometers measure density of magnetic flux of one picotesla, or ten nanogauss, using 100 milliwatts of power. A piezomagnetometer's small size, low power and low cost make arrays of piezomagnetometers practical on a large scale. The present invention measures strain in a magnetostrictive material to measure magnetic or electric fields. Operation of a piezomagnetometer is passive, direct and linear and eliminates power required to drive a carrier as well as electronics required for phase sensitive detection.

The present invention is a piezomagnetometer having a layered composite structure of alternating layers of piezoelectric and magnetostrictive material. Possible piezoelectric materials include quartz and lead zirconate-titanate ceramic (PZT). Possible magnetostrictive materials include nickel, TERFENOL-D and METGLAS. A piezomagnetometer having a PZT/TERFENOL-D composite or a PZT/METGLAS composite exhibits the greatest sensitivity.

Piezomagnetometers operate in response to ambient magnetic or electric fields. Those fields strain the magnetostrictive layers of the composite structure. Strain in the magnetostrictive layers stresses the piezoelectric layers and polarizes the piezoelectric layers electrically. The polarization of the piezoelectric layers is proportional to the strength of the magnetic field parallel to the composite structure, thus measuring the ambient field strength. In a fluctuating magnetic field, the composite structure is an electrical current source connected in parallel with a capacitor. Strength of the current source is proportional to amplitude of the magnetic fluctuations. The measurement circuit reads voltage across a resistor connected in parallel with capacitance of the composite structure. The measurement circuit effectively measures open circuit voltage between electrodes of the piezoelectric layer and gives a uniform response to oscillation.

In one operation, the present invention is incorporated into a detection system that includes a power supply, signal conditioning electronics, packaging and deployment, and a means for sensor interrogation. The piezomagnetometer itself is passive and uses no power. Associated electronics draw all of the power. Since delivering power from remote locations is not always a tenable option, the system must function autonomously. A possible power supply is solar cells, with a battery backup for nighttime operation.

The operational resolution of the present invention is improved by incorporating signal conditioning electronics. Low pass filters with cutoff frequencies of about 1 Hz are used to reduce sensor noise from ambient magnetic fluctuations and sensor motion. Other band pass filters are used to help characterize targets. Thermometers, such as thermocouple gauges, and temperature compensation circuits are incorporated to ensure that signals are not the spurious result of changes in temperature. Electronics can also include analog to digital conversion of the signal for storage and data transmission. Practicality dictates minimizing the size, weight and power consumption of the electronics.

The composite structure, along with the electronics and the power supply, are packaged together in a way that is suitable with the method of deployment. A possible configuration is imbedding an array of packaged units in long cables. These cables can be deployed by aircraft in remote or hostile terrain or can be manually positioned by ground controls. Optical fibers in the cables connect the array of packaged units to base stations that scan the array and transmit data to intelligence centers. Video screens at the intelligence centers show each piezomagnetometer's output on a grid that identifies the piezomagnetometer's position in the array. Cables, when properly positioned in a rectangular grid, will give coordinates and vectors of vehicle, equipment, and human movement.

These and further and other objects and features of the invention are apparent in the disclosure, which includes the above and ongoing written specification, with the claims and the drawings.

BRIEF DESCRIPTION OF THE DRAWINGS

FIG. 1 shows the composite structure of the piezomagnetometer, formed by a stack of alternating piezoelectric and magnetostrictive layers.

FIG. 2 is an illustration of the strain elements in magnetostrictive and piezoelectric layers.

FIG. 3 shows an element of the composite structure of the present invention, which is formed by a piezoelectric layer and a magnetostrictive layer.

FIG. 4 shows a piezomagnetometer having a composite structure comprising multiple stacks of elements.

FIG. 5 is an illustration of a measuring circuit for measuring the voltage across the electrodes of each piezoelectric layer in the composite structure.

DETAILED DESCRIPTION OF THE DRAWINGS

Figure 6:
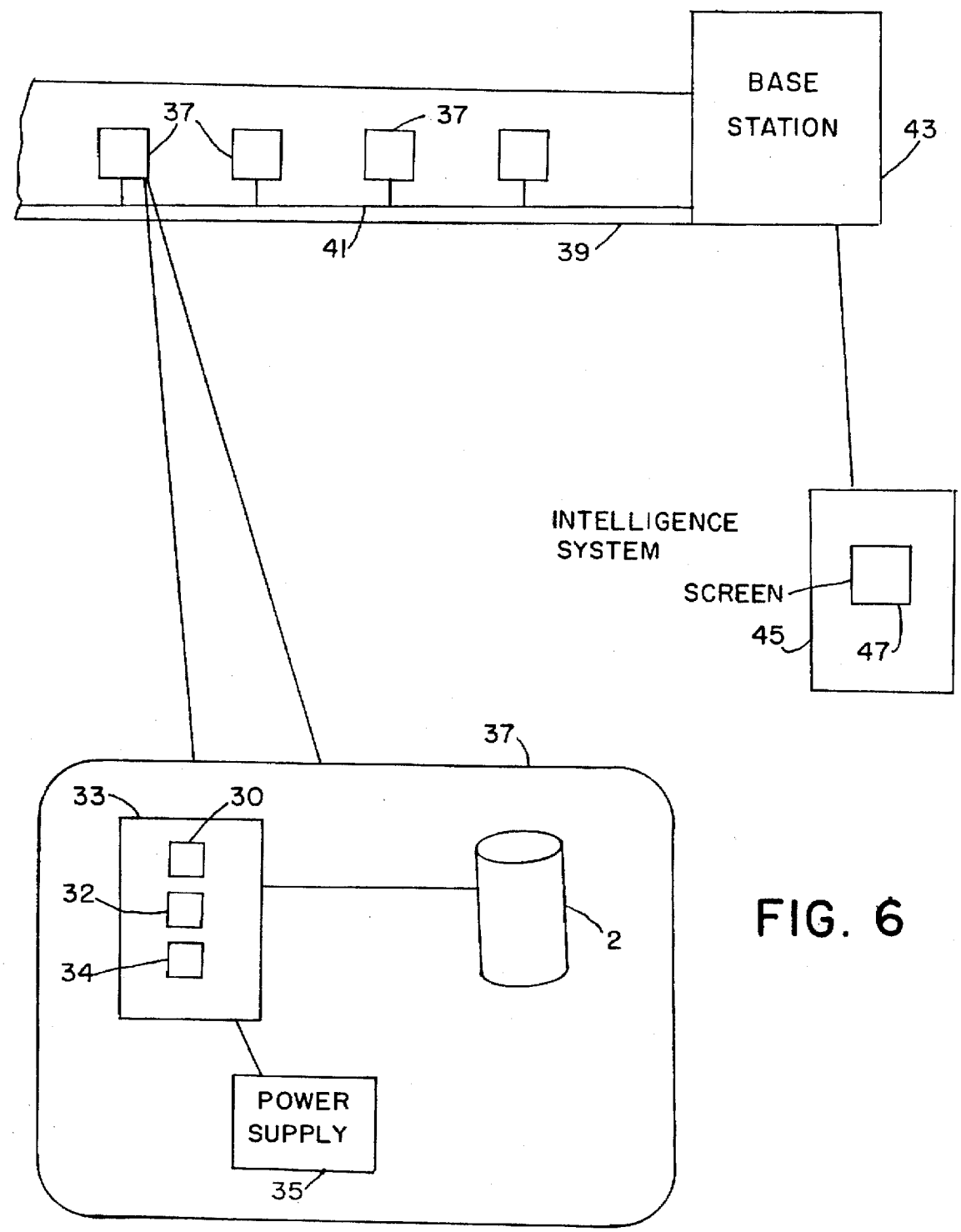
FIG. 6 shows a practical system into which the present invention can be incorporated.

Referring to the drawings and to FIG. 1, interleaved layers of piezoelectric material 3 and magnetostrictive material 5 form the magneto-electric composite structure 2 of the piezomagnetometer 1. Electric or magnetic fields 7 distort and electrically polarize the composite structure 2. Those magnetoelectric effects result from the constraint of equal displacements and zero net force at the interfaces of the piezoelectric 3 and magnetostrictive material 5.

The composite structure 2 of the piezomagnetometer 1 is sensitive to the component of the magnetic field parallel to the piezoelectric layers 3 and magnetostrictive layers 5. For thin layers, stress and strain are parallel to the interfaces and are uniform across a layer. The magnetic field component 7 strains a magnetostrictive layer 5 laterally. For a lateral, uniform strain, equal displacements parallel to an interface require an equal strain in the adjacent piezoelectric layer 3. The strain polarizes the piezoelectric layer 3 normal to the interface, giving an electric displacement and an electric field 9. Conversely, the electric field 9 component strains a piezoelectric layer 3 laterally. An equal strain in the adjacent magnetostrictive layer 5 magnetizes the magnetostrictive layer 5 parallel to the interface, giving a magnetic induction 11. Magnets 47 are positioned adjacent to the composite structure 2 and supply a bias field to the composite structure 2. One embodiment uses magnets made of samarium-cobalt.

FIG. 2 illustrates the strain elements in each layer. Elastic strain in the magnetostrictive layer 5 is the total strain less the magnetic strain 15. Elastic strain in the layer 5 comes from the electric strain 13 imposed by the piezoelectric layer 3 and opposing elastic strains. Electric strain 13 is stress free in the piezoelectric layer 3 but stresses the magnetostrictive layer 5. Elastic strain in the piezoelectric layer 3 is the total strain less the electric strain 13. Elastic strain in the layer 3 comes from the magnetic strain 15 imposed by the magnetostrictive layer 5 and opposing elastic strains. Magnetic strain 15 is stress free in the magnetostrictive layer 5 but stresses the piezoelectric layer 3.

FIG. 3 shows an element 17 of a composite structure 2 of a piezomagnetometer 1. An element 17 is composed of one magnetostrictive layer 5 bonded to one piezoelectric layer 3. Stacks of elements 17 form the composite structure 2. A magnetic field 7 parallel to the magnetostrictive layer 5 produces a-magnetic strain in the magnetostrictive layer 5. The magnetic strain imposes an elastic strain on the piezoelectric layer 3 through the bondline 21. Stress in the piezoelectric layer 3 polarizes the piezoelectric layer 3 and produces an electric displacement and an electric field 9 across electrodes 19 positioned on opposite faces of the piezoelectric layer 3. Voltage between the electrodes 19 measures the magnetic field 7. Integrating the voltage responses across each piezoelectric layer 3 in a stack of alternating layers gives high sensitivity at low frequency.

The electric field in turn produces an electric strain in the piezoelectric layer 3 that imposes an elastic strain and stress on the magnetostrictive layer 5 to oppose the magnetic strain. Equal displacements and balance of forces at the bondline 21 determine the elastic strain and resulting stress in each layer.

Stacked single elements 17 have alternating piezoelectric layers 3 and magnetostrictive layers 5. Two possible materials for the piezoelectric layers 3 are quartz and lead zirconate-titanate ceramic (PZT). Possible materials for the magnetostrictive layers 5 include nickel, TERFENOL-D and METGLAS. METGLAS is an amorphous, iron-based, rapidly solidified, metallic alloy. A piezomagnetometer 1 having a PZT/TERFENOL-D composite structure 2 or a PZT/METGLAS composite structure 2 exhibit the greatest sensitivity. Composite structures 2 of quartz/nickel and PZT/nickel give lower sensitivities. The high sensitivities of the PZT/TERFENOL-D and PZT/METGLAS composite structures 2, which are about 0.03 mV/(A/m), enable measurement of ten microgauss field amplitudes with a single element. Measurements of a 25 µm layer of METGLAS bonded to a 125 µm thick wafer of PZT shows a resolution of about 0.6 nT/√Hz, above a few Hertz. A composite structure 2 of 200 layers, about 1 cm tall and 1 cm in diameter, can give a resolution of 1 pT/√Hz at frequencies above a few Hertz.

A single element 17 having a PZT layer and a TERFENOL-D layer or a PZT layer and a METGLAS layer can resolve signals above a few nanotesla. Elements 17 of nickel with PZT or nickel with quartz can resolve signals above a few tens of nanotesla. One method of increasing sensitivity and resolution is to anneal and polarize the magnetostrictive material to enhance its piezomagnetism. Sensitivity can also be augmented by using a thicker magnetostrictive layer 5. A third approach for increasing resolution and sensitivity is to stack the elements 17 in parallel.

A preferred embodiment of the present invention has a stack of one hundred elements 17 connected in parallel to achieve signal resolution of 1 pT/√Hz. One hundred piezoelectric layers 3 are sandwiched between alternating magnetostrictive layers 5 in a single stack 201 layers thick. The magnetostrictive layers 5 double as electrodes 19 for the voltage measurement across the piezoelectric layers 3. In one embodiment, each piezoelectric layer 3 is 254 µm thick. If TERFENOL-D is used, preferred embodiments have magnetostrictive layers 5 which are each 635 µm thick. If METGLAS is used, preferred embodiments have magnetostrictive layers 5 which are each 25 µm thick.

In a second embodiment, the piezomagnetometer 1 has multiple composite structures 2 of stacked elements 17, as shown in FIG. 4. A preferred embodiment has four composite structures 2, each with fifty-one alternating piezoelectric layers 3 and magnetostrictive layers 5, and in which twenty-five of these layers are piezoelectric layers 3.

Connecting multiple elements 17 in parallel together with increasing the sensitivity of each element 17 results in a hundredfold increase in signal resolution.

FIG. 5 is an illustration of a measurement circuit 23 that is used to measure the voltage across the electrodes 19 of a piezoelectric layer 3. A current source 25 in parallel with a capacitance 27 schematically describes the element 17 of the composite structure 2 of the piezomagnetometer 1 to which the measurement circuit 23 is connected. The element 17 is connected in parallel to a resistor 29. An amplifier 31 with high input impedance and an auxiliary 15 volt source measures voltage across the resistor 29 and provides an output voltage. The magnitude of the voltage from each element 17 of the composite structure 2 gives the sensitivity of the piezomagnetometer 1.

FIG. 6 shows a practical piezomagnetometer 1 system. The composite structure 2, signal conditioning electronics 33, and a power supply 35 are bundled into a package unit 37. One embodiment uses solar cells as the primary source with a battery reserve. Preferably, each solar cell is in the order of 0.1 m$^2$ in area and uses amorphous silicon technology. The battery backup can be lithium cells for optimum energy density. One embodiment of the piezomagnetometer 1 system has signal conditioning electronics 33 that include low pass filters 30, thermometers 32 and temperature compensation circuits 34.

FIG. 6 shows multiple package Units 37 imbedded in a cable 39. An optical fiber 41 in the cable 39 connects a series of package units 37. A preferred embodiment has a system in which 20–50 m long segments of optical cable 39 connects a series of package units 37. The cable 39 connects to an unmanned base station 43 that interrogates the package units 37 and transmits data to an intelligence system 45, where a visual image of the detection scene can be displayed on a screen 47.

While the invention has been described with reference to specific embodiments, modifications and variations of the invention may be constructed without departing from the scope of the invention, which is defined in the following claims.

I claim:

1. A magnetic and electric field sensor and measurement apparatus comprising a composite structure having alternatingly secured plural piezoelectric material layers and magnetostrictive material layers, magnets positioned adjacent to the composite structure for supplying a bias field to the composite structure, and a measurement circuit connected to the piezoelectric layers for measuring output of the piezoelectric layers in the composite structure.

2. The apparatus of claim 1, further comprising signal conditioning electronics connected to the composite structure.

3. The apparatus of claim 2, wherein the signal conditioning electronics includes interconnected low pass filters, thermometers and temperature compensation circuits.

4. The apparatus of claim 1, wherein the magnetostrictive layers are of METGLAS and the piezoelectric layers are of PZT.

5. The apparatus of claim 1, wherein the magnetostrictive layers are of METGLAS and the piezoelectric layers are of quartz.

6. The apparatus of claim 1, wherein the magnetostrictive layers are of nickel and the piezoelectric layers are of PZT.

7. The apparatus of claim 1, wherein the magnetostrictive layers are of nickel and the piezoelectric layers are of quartz.

8. The apparatus of claim 1, wherein the magnetostrictive layers are of TERFENOL-D and the piezoelectric layers are of PZT.

9. The apparatus of claim 1, wherein the magnetostrictive layers are of TERFENOL-D and the piezoelectric layers are of quartz.

10. The apparatus of claim 1, wherein the magnets are made of samarium-cobalt.

11. The apparatus of claim 1, wherein the composite structure has 201 alternating layers of piezoelectric and magnetostrictive material, the structure having 100 piezoelectric layers and 101 magnetostrictive layers.

12. The apparatus of claim 11, wherein the piezoelectric material is PZT and the magnetostrictive material is TERFENOL-D.

13. The apparatus of claim 12, wherein the piezoelectric PZT layers are each 254 μm thick and the magnetostrictive TERFENOL-D layers are each 635 μm thick.

14. The apparatus of claim 11, wherein the piezoelectric material is PZT and the magnetostrictive material is METGLAS.

15. The apparatus of claim 14, wherein the piezoelectric PZT layers are each 254 μm thick and the magnetostrictive METGLAS layers are each 25 μm thick.

16. A magnetic and electric field sensor and measurement apparatus comprising multiple composite structures, each composite structure having alternatingly secured piezoelectric material layers and magnetostrictive material layers, and a measurement circuit connected to the piezoelectric layers for measuring output of the piezoelectric layers in the composite structures.

17. The apparatus of claim 16, further comprising magnets positioned adjacent to the composite structures for supplying a bias field to the composite structures.

18. The apparatus of claim 16, wherein sensor comprises four adjacently secured composite structures.

19. The apparatus of claim 18, wherein each composite structure comprises 51 alternating piezoelectric and magnetostrictive layers, 25 of which are piezoelectric layers.

20. The apparatus of claim 16, wherein the piezoelectric layer is made of a material selected from the group consisting of quartz and PZT.

21. The apparatus of claim 16, wherein the magnetostrictive layer is made of a material selected from the group consisting of nickel, TERFENOL-D and METGLAS.

22. A method for sensing and measuring magnetic and electric fields comprising the steps of straining plural magnetostrictive layers by a applying magnetic field thereby stressing and polarizing alternately placed plural piezoelectric layers for generating a current across the layers, and measuring the current by a detector.

* * * * *